(12) United States Patent
Chae et al.

(10) Patent No.: US 8,344,615 B2
(45) Date of Patent: Jan. 1, 2013

(54) ORGANIC ELECTROLUMINESCENT DEVICE AND METHOD FOR MANUFACTURING THE SAME

(75) Inventors: Gee Sung Chae, Incheon-si (KR); Sung Hee Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/945,559

(22) Filed: Nov. 12, 2010

(65) Prior Publication Data

US 2011/0057561 A1    Mar. 10, 2011

Related U.S. Application Data

(62) Division of application No. 11/819,824, filed on Jun. 29, 2007, now Pat. No. 7,833,569.

(30) Foreign Application Priority Data

Dec. 20, 2006  (KR) ............................ P 2006-130662
Jun. 26, 2007  (KR) ............................ P 2007-063032

(51) Int. Cl.
    *H01L 51/00*   (2006.01)
(52) U.S. Cl. ........................................ 313/504; 313/506
(58) Field of Classification Search .................. 313/504, 313/506; 428/690, 917
    See application file for complete search history.

(56) References Cited

U.S. PATENT DOCUMENTS

| | | | |
|---|---|---|---|
| 5,972,419 A | 10/1999 | Roitman | |
| 2001/0001050 A1 | 5/2001 | Miyashita et al. | |
| 2003/0044639 A1 | 3/2003 | Fukuda | |
| 2003/0052597 A1* | 3/2003 | Sakurai | ......................... 313/504 |
| 2004/0023010 A1 | 2/2004 | Bulovic et al. | |
| 2005/0147766 A1 | 7/2005 | Aoki | |
| 2005/0196526 A1 | 9/2005 | Ishida | |
| 2006/0127563 A1* | 6/2006 | Toyoda et al. | .................. 427/58 |
| 2007/0264899 A1* | 11/2007 | Kumagai | ........................ 445/24 |

FOREIGN PATENT DOCUMENTS

| | | |
|---|---|---|
| TW | 200605719 | 2/2006 |
| TW | 1265192 | 11/2006 |

* cited by examiner

*Primary Examiner* — Karabi Guharay

(74) *Attorney, Agent, or Firm* — Morgan, Lewis & Bockius LLP

(57) ABSTRACT

An organic electroluminescent device includes: a first electrode and a first carrier transport layer (CTL) on a substrate having sub-pixels that include a first light emitting area (LEA) for a first color, a second LEA for a second color, and a third LEA for a third color, a first hydrophilic material on the first CTL in the first LEA, a first color light emitting layer (LEL) on the first hydrophilic material in the first LEA, a second hydrophilic material on the first CTL in the second LEA, a second color LEL on the second hydrophilic material in the second LEA, a third hydrophilic material on the first and second color LELs and on the first CTL in the third LEA, a third color LEL on the third hydrophilic material, a second CTL on the third color LEL, and a second electrode on the second CTL.

1 Claim, 9 Drawing Sheets

ORGANIC ELECTROLUMINESCENT DEVICE AND METHOD FOR MANUFACTURING THE SAME

This is a divisional application of application Ser. No. 11/819,824 filed on Jun. 29, 2007 now U.S. Pat. No. 7,833,569 which is hereby incorporated by reference. This application also claims the benefit of Korean Patent application No. P2006-130662 filed on Dec. 20, 2006 and of Korean Patent Application No. P2007-063032 filed on Jun. 26, 2007 which are hereby incorporated by reference.

BACKGROUND OF THE INVENTION

1. Field of the Invention

Embodiments of the present invention relate to a display device, and more particularly, an organic electroluminescent device and a method of manufacturing the same.

2. Discussion of the Related Art

A representative example of a flat panel display is a Liquid Crystal Display (LCD) device that is light in weight and consumes a small amount of power. Thus, the LCD device has been widely used as the flat panel display throughout the world. However, the LCD device is not a light emitting device. That is, it is necessary for the LCD device to use an additional light source, for example, a backlight unit to emit the light. Also, the LCD device has technical limitations in brightness, contrast, and viewing angle, and has difficulty in increasing the size of a valid display area. To solve the above-mentioned problems, many developers are conducting intensive research into an improved flat panel display.

An organic electroluminescent device is a self-light-emitting device. The organic electroluminescent device has a desirable viewing angle and contrast, which are superior to those of the LCD device. There is no need to use a backlight. The organic electroluminescent device can be made small in size, light in weight, and thin in thickness. Also, the organic electroluminescent device has power consumption superior to that of the LCD device. For example, the organic electroluminescent device can be driven at a DC low voltage, has rapid response speed, has very strong resistance to an external impact because it is made of solids, has a wide range of available temperature, and is composed of a low-priced components. As a result, the organic electroluminescent device is superior to the liquid crystal display (LCD) device.

A fabrication process of the organic electroluminescent device is mostly composed of a deposition process and an encapsulation process, different from the liquid crystal display (LCD) and a Plasma Display Panel (PDP), such that the fabrication process of the organic electroluminescent device is considered to be very simple.

FIG. 1 is a schematic diagram illustrating bands of a unit pixel of a related art organic electroluminescent device. Referring to FIG. 1, the organic electroluminescent device includes a hole transport layer 3 (also called a hole transport layer), a light emitting layer 4 (also called a light emitting layer), and an electron transport layer 5 (also called an electron transport layer), which are located between an anode electrode 1 and a cathode electrode 7. To effectively inject holes and electrons, the organic electroluminescent device may further include a hole injection layer 2 and an electron injection layer 6, which are located between the electron transport layer 5 and the cathode electrode 7. In this case, holes are transmitted from the anode electrode 1 to the hole injection layer 2 and the hole transport layer 3, and are then injected into the light emitting layer 4. Electrons are transmitted from the cathode electrode 7 to the electron injection layer 6 and the electron transport layer 5, and are then injected into the light emitting layer 4. The holes and the electrons form an excitation 8, such that the excitation 8 generates the light corresponding to energy between the electron and the hole.

The anode electrode 1 is selected from a transparent conductive material having a high work function, such as an ITO (Indium Tin Oxide), an IZO (Indium Zinc Oxide), and an ITZO (Indium Tin Zinc Oxide)), such that the light passed through the anode electrode 1. The cathode electrode 7 is selected from a chemically stable metal having a low work function.

The above-mentioned organic electroluminescent device can form a light emitting layer having one of three colors (Red, Green, and Blue) for each pixel. The light emitting layer is mainly composed of a light emitting material.

During the fabrication process of the above-mentioned light emitting material, an irregular pattern occurs in the light emitting layer because light emitting materials of individual color areas have different dry times and different viscosities such that the light emitting layer is inappropriate for a fine light emitting layer of several micrometers and an unexpected mixed color occurs in the vicinity of an edge part of the light emitting layer, resulting in the deterioration of color purity.

SUMMARY OF THE INVENTION

Accordingly, embodiments of the present invention are directed to an organic electroluminescent device and a method of manufacturing the same that substantially obviates one or more problems due to limitations and disadvantages of the related art.

An object of embodiments of the present invention is to provide an organic electroluminescent device and a method of manufacturing the same having a fine light emitting layer of several micrometers.

Another object of embodiments of the present invention is to provide an organic electroluminescent device and a method of manufacturing the same having increased color purity in each color of light emitting layer.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a method for manufacturing an organic electroluminescent device includes forming a first electrode and a first carrier transport layer on a substrate having sub-pixels that include a first light emitting area for a first color, a second light emitting area for a second color, and a third light emitting area for a third color, forming a first color light emitting layer in the first light emitting area using a first hydrophobic material, forming a second color light emitting layer in the second light emitting area using a second hydrophobic material, forming a third color light emitting layer in the first, second and third light emitting areas or in the third light emitting area, forming a second carrier transport layer on the third light emitting area; and forming a second electrode on the second carrier transport layer.

In another aspect, a method for manufacturing an organic electroluminescent device includes forming a first electrode and a first carrier transport layer on a substrate having sub-pixels that include a first light emitting area for a first color, a second light emitting area for a second color, and a third light emitting area for a third color, forming a first hydrophilic material on the first carrier transport layer of the first light emitting area, forming a first color light emitting layer on the first hydrophilic material, forming a second hydrophilic material on the first carrier transport layer of the second light emitting area, forming a second color light emitting layer on the second hydrophilic material, forming a third hydrophilic material on the first carrier transport layer of the third light emitting area, the first color light emitting layer and the second color light emitting layer, or on the first carrier transport layer of the third light emitting area, forming the third color light emitting layer on the third hydrophilic material, forming a second carrier transport layer on the third color light emitting layer, and forming a second electrode on the second carrier transport layer.

In another aspect, an organic electroluminescent device includes a first electrode and a first carrier transport layer on a substrate having sub-pixels that include a first light emitting area for a first color, a second light emitting area for a second color, and a third light emitting area for a third color, a first hydrophilic material on the first carrier transport layer in the first, second and third light emitting areas, a first color light emitting layer on the first hydrophilic material in the first light emitting area, a second color light emitting layer on the first hydrophilic material in the second light emitting area, a second hydrophilic material on the first and second color light emitting layers, a third color light emitting layer on the first hydrophilic material in the third light emitting area and the second hydrophilic material, a second carrier transport layer on the third color light emitting layer, and a second electrode on the second carrier transport layer.

In yet another aspect, an organic electroluminescent device includes a first electrode and a first carrier transport layer on a substrate having sub-pixels that include a first light emitting area for a first color, a second light emitting area for a second color, and a third light emitting area for a third color, a hydrophilic material on the first carrier transport layer in the first, second and third light emitting areas, a first color light emitting layer on the hydrophilic material in the first light emitting area, a second color light emitting layer on the hydrophilic material in the second light emitting area, a third color light emitting layer on the hydrophilic material in the third light emitting area, a second carrier transport layer on the first, second and third color light emitting layers, and a second electrode on the second carrier transport layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts.

FIGS. 2A-2K are cross-sectional views illustrating fabrication processes of an organic electroluminescent device according to an embodiment of the present invention. The organic electroluminescent device of FIGS. 2A-2K is depicted on the basis of light emitting areas of each sub-pixel acting as a minimum unit of the screen.

Figure 1:
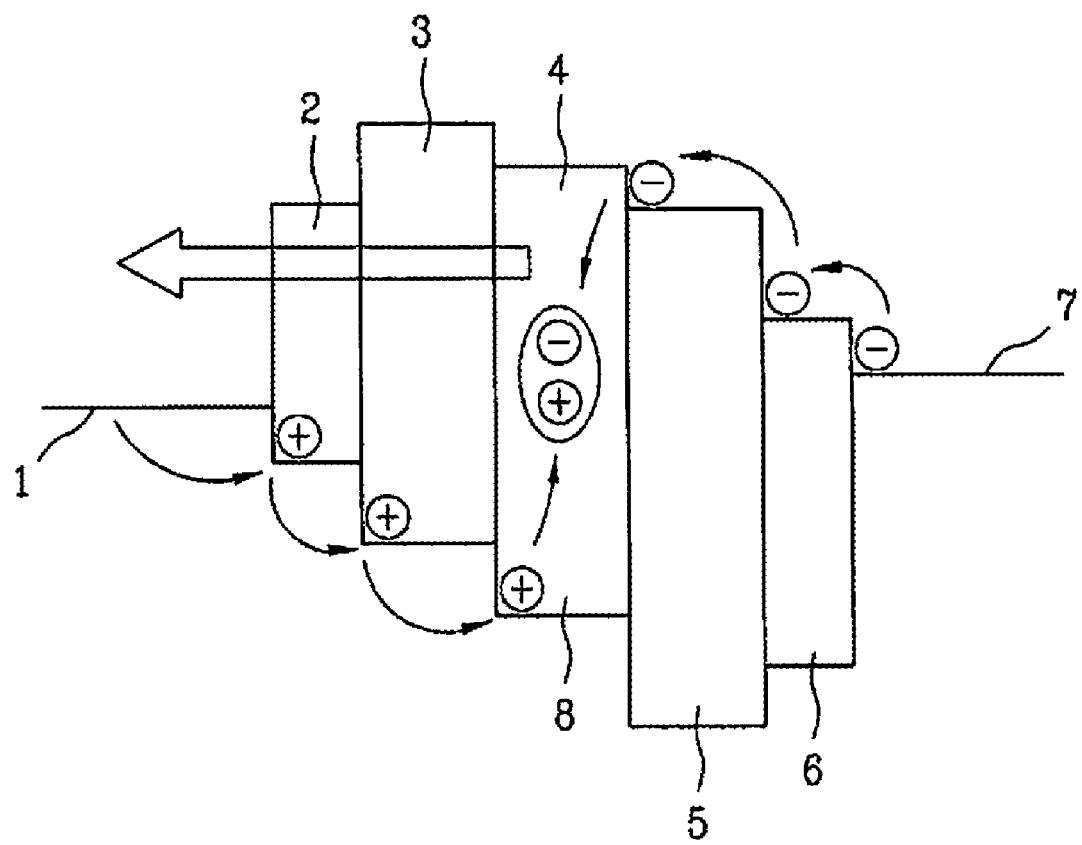
FIG. 1 is a schematic diagram illustrating bands of a unit pixel of the related art electroluminescent device.
Figure 2A:
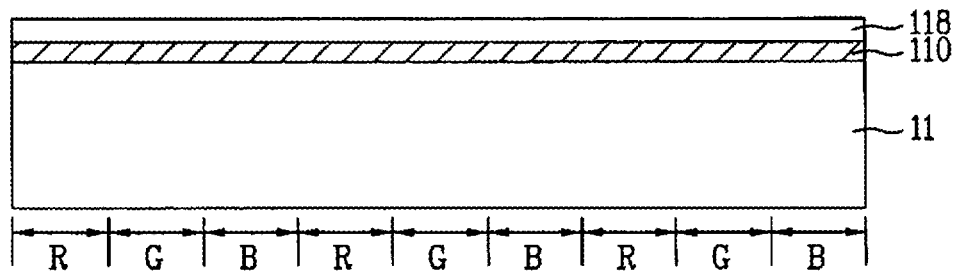
FIGS. 2A-2K are cross-sectional views illustrating fabrication processes of an organic electroluminescent device according to an embodiment of the present invention.

Referring to FIG. 2A, a first electrode 110 is deposited on a substrate 11 that includes different colors of light emitting areas, such as a red (R) light emitting area, a green (G) light emitting area, and a blue (B) light emitting area. A first carrier transport layer 118 is deposited on the substrate 11 on which the first electrode 110 is formed. The first electrode 110 corresponds to an anode electrode acting as a lower electrode. The first electrode 110 is selected from a transparent conductive material. Preferably, the first electrode 110 may be composed of any one of an ITO, an IZO, and an ITZO. The first carrier transport layer 118 can sequentially include a hole injection layer and a hole transport layer. The substrate 11 is used as a substrate for the organic electroluminescent device, such that it corresponds to an array substrate including both a thin film transistor (TFT) and a storage capacitor.

Figure 2B:
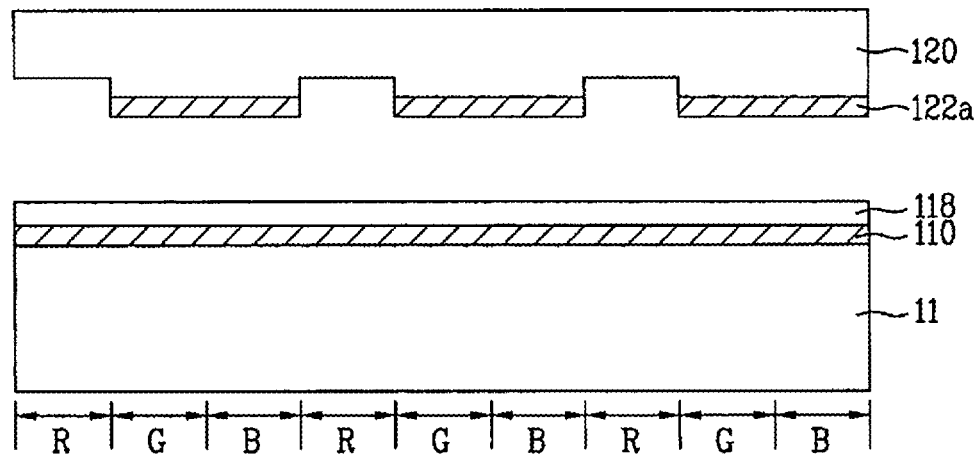

Referring to FIG. 2B, a first polydimethylsiloxane (PDMS) stamp 120 is aligned to the substrate 11 on which the first carrier transport layer 118 is formed. The PDMS stamp 120 is for contacting the first carrier transport layer 118. More particularly, the first PDMS stamp 120 has a protruding surface in contact with the green (G) light emitting area and the blue (B) light emitting area, and a recessed surface above the red (R) light emitting area. In this case, a first octadecyltrichlorosilane (OTS) pattern 122a is made of a hydrophobic material. The first OTS pattern 122a is formed on the protruding surface of the first PDMS stamp 120 corresponding to the green (G) light emitting area and the blue (B) light emitting area.

Figure 2C:
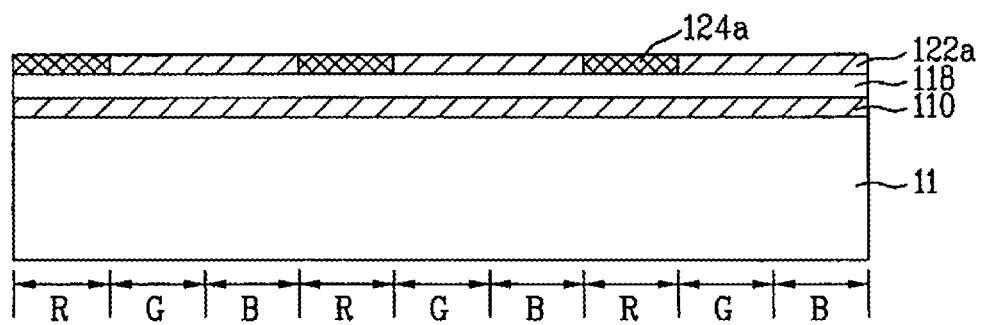

Referring to FIG. 2C, the PDMS stamp 120 including the first OTS pattern 122a is brought into contact with the first carrier transport layer 118, such that the first OTS pattern 122a is transferred to the first carrier transport layer 118 of the green (G) light emitting area and the blue (B) light emitting area. The first OTS pattern may also be made by other methods, such as a roll printing technique. According to the roll printing technique, the OTS pattern 122a is formed on a printing roller using a printing plate and then is transcribed onto the first carrier transport layer 118, such that the OTS pattern 122a is formed.

Next, if the substrate 11 equipped with the first OTS pattern 122a is soaked into a solvent, including a hydrophilic amine group to make a first amine group pattern 124a of hydrophilic material only on the first carrier transport layer 118 of the red (R) light emitting area.

Therefore, the first carrier transport layer 118 of each of the green (G) light emitting area and the blue (B) light emitting area is defined as a hydrophobic area due to the first OTS pattern 122a composed of a hydrophobic material. The first carrier transport layer 118 of the red (R) light emitting area is defined as a hydrophilic area due to the first amine group pattern 124a composed of a hydrophilic material.

Figure 2D:
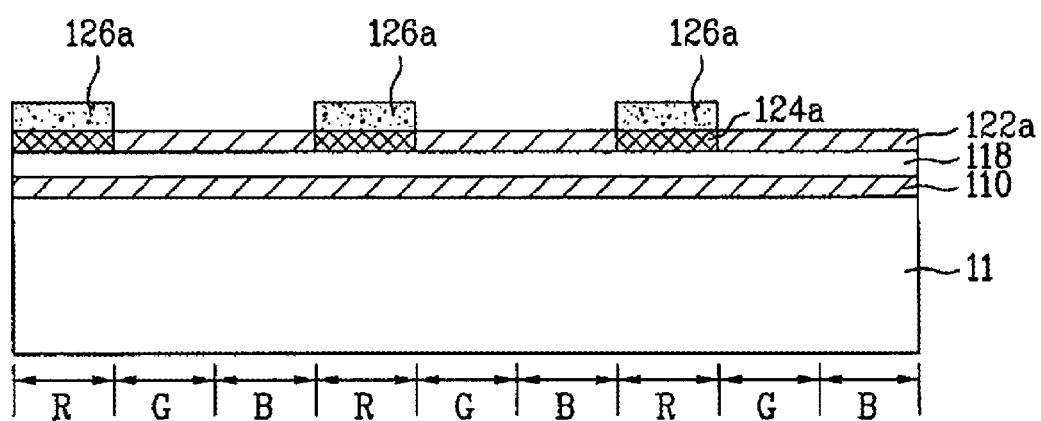

Referring to FIG. 2D, if the substrate 11 having hydrophilic and hydrophobic areas is coated with the R (Red)-light emitting solution, the R light emitting layer 126a is formed only on the first amine group pattern 124a, wherein the R light emitting layer 126 has a thickness between about 290 Å and 390 Å. In other words, if the red (R) organic electroluminescent solution is coated, the R organic electroluminescent solution is not coated on the first OTS pattern 122a but is coated only on the first amine group pattern 124a composed of a hydrophilic material.

The red (R) light emitting solution for forming the red (R) light emitting layer 126a may be selected from among a QD (Quantum Dot) solution, a specific solution in which a small-molecule material is distributed to an organic solvent, and a solution-processing material, such as a dendrimer. In the case of the QD solution, a hydrophilic solvent has a semiconductor material quantum dot (QD), such as CdSe, CdTe or InP, having an energy band gap in a visible-ray area.

There are a variety of coating methods for providing the R-light-emitting solution, for example, a pen-type coater method, a bar coater method, a slit die coating method, a solvent method, and a roll-printing method. The pen-type coater method allows a pen, blade, or slit to adhere closely to the surface of the substrate on which a light-emitting solution is deposited, applies pressure to the pen, blade or slit on the substrate surface, and pushes the pen, blade or slit in a single direction. The roll-printing method forms a predetermined pattern on a printing roller using a printing plate, and transcribes the pattern on the substrate, such that a desired pattern is formed.

Figure 2E:
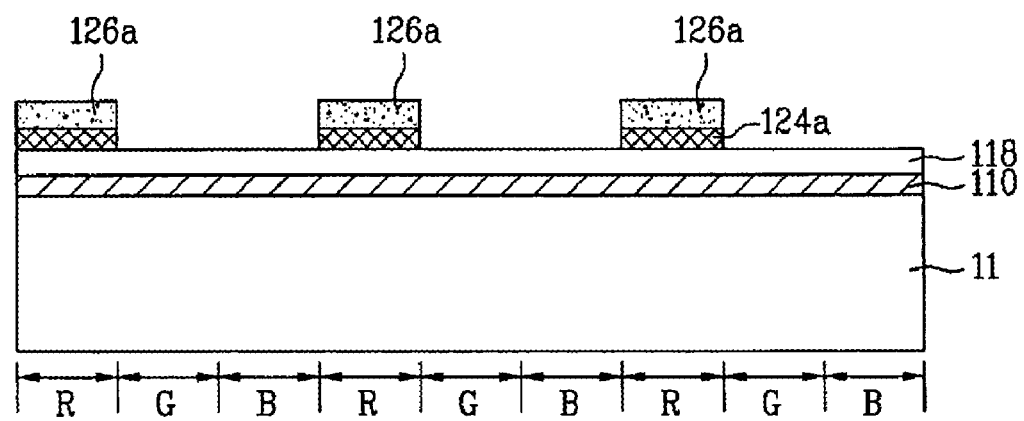

Referring to FIG. 2E, the substrate 11 having the first OTS pattern 122a is soaked into the OTS-removal solution to remove the first OTS pattern 122a such that the fabrication process of the R-light emitting layer 126a is completed.

Figure 2F:
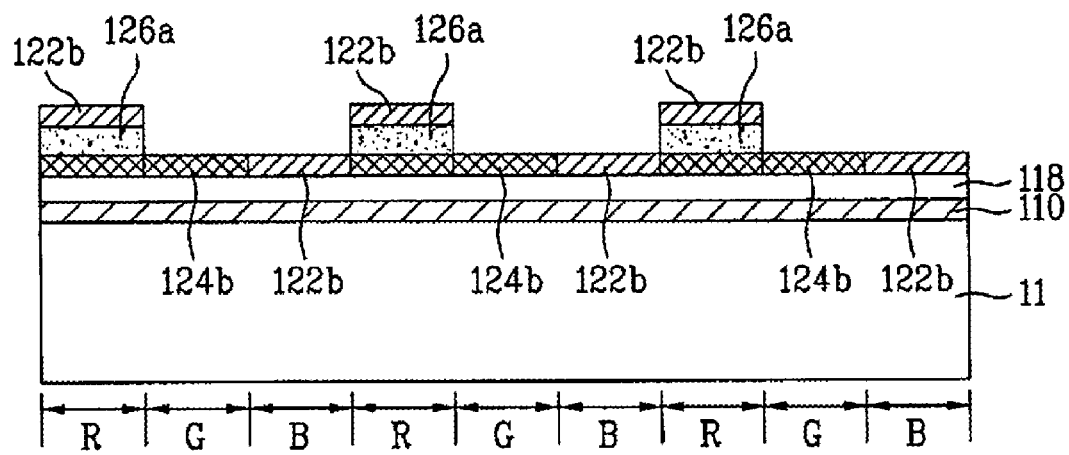

Referring to FIG. 2F, a second PDMS stamp (not shown in FIG. 2F) including a second OTS pattern is aligned to the first carrier transport layer 118 equipped with the R-light emitting layer 126a. The second PDMS stamp is brought into contact with the substrate 110 such that the second OTS pattern 122b is transferred to the first carrier transport layer 118 of the blue (B) light emitting area and the R-light emitting layer 126a. That is, the second PDMS stamp has a protruding surfaces contacting the blue (B) light emitting area and the R-light emitting layer 126a. Then, the second OTS pattern 122b is formed on the protruding surfaces of the second PDMS stamp. As the second PDMS stamp is brought into contact with the substrate 11, the second OTS pattern 122b is transferred to the first carrier transport layer 118 of the blue (B) light emitting area and the R-light emitting layer 126a. In this case, since the R-light emitting layer 126a is already formed in the red (R) light emitting area, a step difference occurs between the red (R) light emitting area and the Blue (B) light emitting area. However, the second PDMS stamp has the contour so that the second OTS pattern 122b can be formed on the first carrier transport layer 118 of the blue (B) light emitting area and the R-light emitting layer 126a of R light emitting area while not contacting the green (G) light emitting area. In the alternative, it may also be formed by other methods, such as the roll-printing method. According to the roll printing method, the second OTS pattern is formed on a printing roller using a printing plate, is transcribed on the first carrier transport layer 118 and the R-light emitting layer 126a, such that the second OTS pattern is formed.

Next, when the substrate 11 equipped with the second OTS pattern 122b is soaked into a solvent including a hydrophilic amine group, the second amine group pattern 124b made of a hydrophilic material is formed only on the first carrier transport layer 118 of the green (G) light emitting area. Therefore, the first carrier transport layer 118 of the blue (B) light emitting area and the R-light emitting layer 126a of the red (R) light emitting area are defined as hydrophobic areas due to the second OTS pattern 122b composed of a hydrophobic material. The first carrier transport layer 118 of the green (G) light emitting area is defined as a hydrophilic area due to the first amine group pattern 124a composed of a hydrophilic material.

Figure 2G:
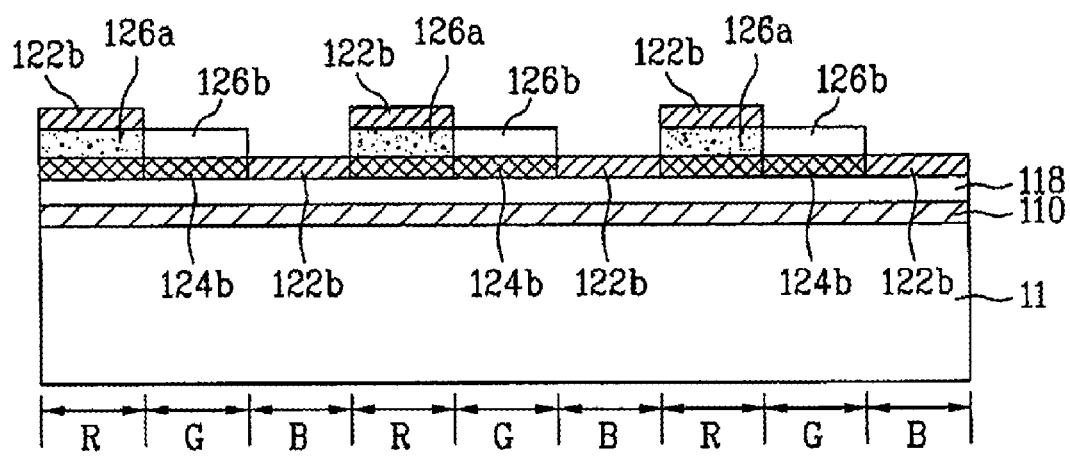

Referring to FIG. 2G, if the substrate 11 having the hydrophilic or hydrophobic areas is coated with the G-light emitting solution, the G-light emitting layer 126b is formed only on the second amine group pattern 124b, wherein the G light emitting layer 126b has a thickness between 290 Å and 390 Å. In other words, when the Green (G) organic electroluminescent solution is coated, the G organic electroluminescent solution is not coated on the second OTS pattern 122b, and is only coated on the second amine group pattern 124b composed of a hydrophilic material.

The Green (G) light emitting solution for forming the Green (G) light emitting layer 126b may be selected from among a QD (Quantum Dot) solution, a specific solution in which a small-molecule material is distributed to an organic solvent, and a solution-processing material, such as a dendrimer. In this case, the QD solution is a hydrophilic solvent having a semiconductor material quantum dot (QD), such as CdSe, CdTe or InP, having an energy band gap in a visible-ray area.

There are a variety of coating methods for providing the G-light-emitting solution, for example, a pen-type coater method, a bar coater method, a slit die coating method, a solvent method, and a roll-printing method. The pen-type coater method allows a pen, blade, or slit to adhere closely to the surface of the substrate on which a light-emitting solution is deposited, applies pressure to the pen, blade or slit on the substrate surface, and pushes the pen, blade or slit in a single direction. The roll-printing method forms a predetermined pattern on a printing roller using a printing plate, and transcribes the pattern on the substrate, such that a desired pattern is formed.

Figure 2H:
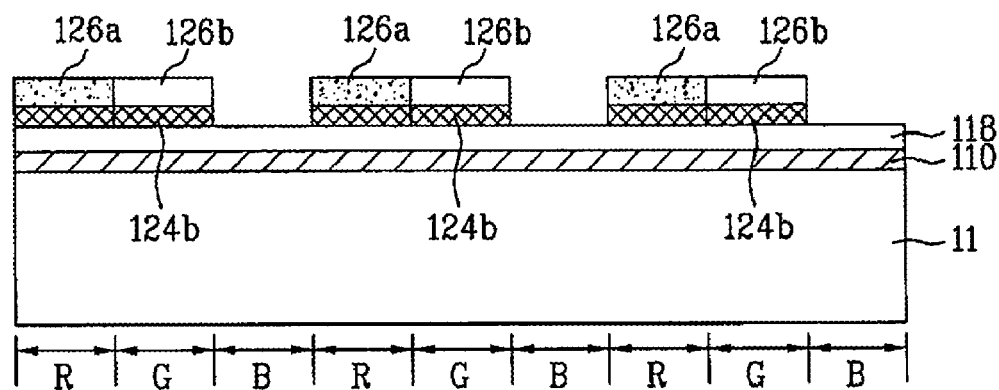

Referring to FIG. 2H, the substrate 11 having the second OTS pattern 122b is soaked in the OTS-removal solution to remove the second OTS pattern 122b such that the fabrication process of the G-light emitting layer 126b is completed.

Figure 2I:
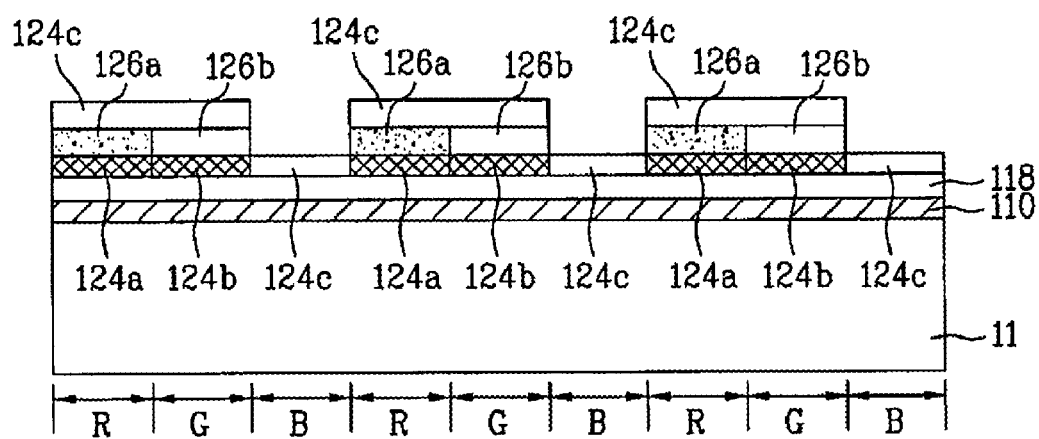

Referring to FIG. 2I, when the substrate 11 equipped with the R and G-light emitting layers 126a and 126b are soaked into the solvent of a hydrophilic amine group, the third amine group pattern 124c is formed on the first carrier transport layer 118 of the blue (B) light emitting area, the R-light emitting layer 126a, and the G-light emitting layer 126b. Therefore, the first carrier transport layer 118 of the blue (B) light emitting area, the R-light emitting layer 126a, and the G-light emitting layer 126b have hydrophilic areas due to the third amine group pattern 124c composed of a hydrophilic material. That is since the QD solution for the R and G light emitting layers 126a and 126b is a hydrophilic solvent, the third amine group pattern 124c is formed on the R and G light emitting layers 126a and 126b as well as on the first carrier transport layer 118 of the blue (B) light emitting areas.

Figure 2J:
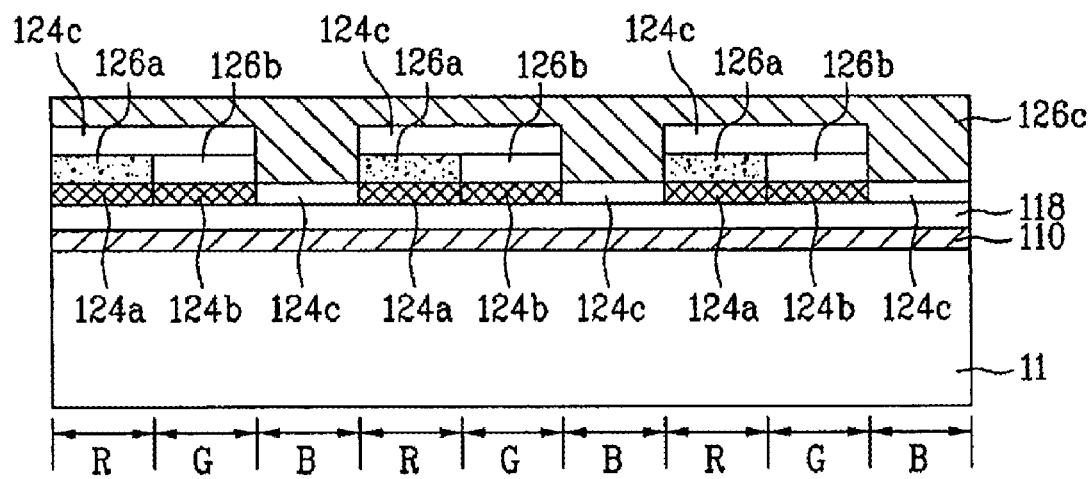

Referring to FIG. 2J, if the substrate 11 having hydrophilic and hydrophobic areas is coated with the Blue (B)-light emitting solution, the B-light emitting layer 126c is formed on the third amine group pattern 124c composed of a hydrophilic material. The Blue (B) light emitting solution for forming the Blue (B) light emitting layer 126c may be selected from among a QD (Quantum Dot) solution, a specific solution in which a small-molecule material is distributed to an organic solvent, and a solution-processing material, such as a dendrimer. In this case, the QD solution is a hydrophilic solvent with a semiconductor material quantum dot (QD), such as CdSe, CdTe or InP, having an energy band gap in a visible-ray area.

In this case, the Blue (B)-light emitting layer 126c is formed in each light emitting area by the third amine group pattern 124c composed of three light emitting areas (i.e., R-area, G-area, and B-area). The Blue (B) light emitting layer 126c formed in the blue (B) light emitting area is formed to have a thickness of 300 Å-400 Å, and the Red (R) light emitting layer 126a formed in the red (R) light emitting area or the Green (G) light emitting layer 126b formed in the green (G) light emitting area is formed to have a thickness of 290 Å-390 Å, such that the Blue (B) light emitting layer 126c formed on the Red (R) light emitting layer 126a and the Green (G) light emitting layer 126b is formed to have a thickness of 5 Å-10 Å. In this way, the Blue (B)-light emitting layer 126c formed on the Red (R) light emitting layer 126a and the Green (G) light emitting layer 126b acts as a Hole Blocking Layer (HBL). The hole blocking layer (HBL) enables the holes to remain in the red and green light emitting layers 126a and 126b for a longer time, such that the probability of recombination, having been reduced by different energy band gap locations of individual light emitting layers, may increase.

There are a variety of coating methods of the B-light-emitting solution, for example, a pen-type coater method, a bar coater method, a slit die coating method, a solvent method, and a roll-printing method. The pen-type coater method allows a pen, blade, or slit to adhere closely to the surface of the substrate on which a light-emitting solution is deposited, applies pressure to the pen, blade or slit on the substrate surface, and pushes the pen, blade or slit in a single direction. The roll-printing method forms a predetermined pattern on a printing roller using a printing plate, and transcribes the pattern on the substrate, such that a desired pattern is formed.

Figure 2K:
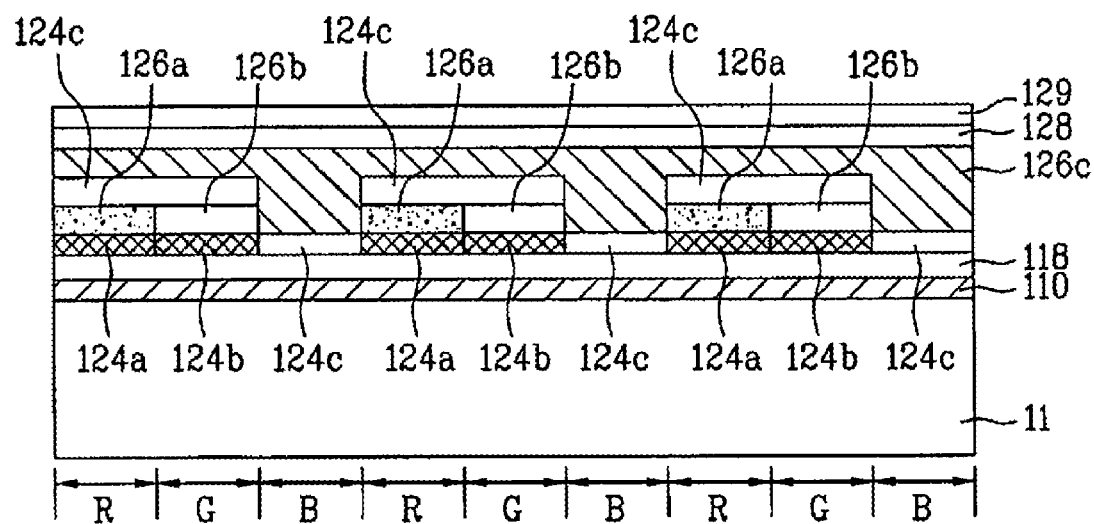

Referring to FIG. 2K, a second carrier transport layer 128 and a second electrode 129 are sequentially formed on the B-light emitting layer 126c. If the second electrode 129 corresponds to a cathode electrode, the second electrode 129 may be selected from at least one metal (e.g., aluminum (AL)) having a low work function, and the second carrier transport layer 128 sequentially includes the electron transport layer and the electron injection layer. The organic electroluminescent device includes the first and second electrodes 110 and 129. The first carrier transport layer 118, the light emitting layers 126a, 126b, 126c, and the second carrier transport layer 128 are sequentially arranged between the first electrode 110 and the second electrode 129, such that the organic electroluminescent device is formed.

FIGS. 3A-3E are cross-sectional views illustrating alternative fabrication process of a third light emitting layer according to another embodiment of the present invention. Rather than using a solvent of a hydrophilic amine group to form the third amine group pattern 124c on the first carrier transport layer 118 of the blue (B) light emitting area, the R-light emitting layer 126a, and the G-light emitting layer 126b shown in FIG. 2I, a third OTS pattern 122c is used to form a third amine group pattern 124c made of a hydrophilic material. Then, the B-light emitting layer 126c' is formed only on the third amine group pattern 124c.

Figure 3A:
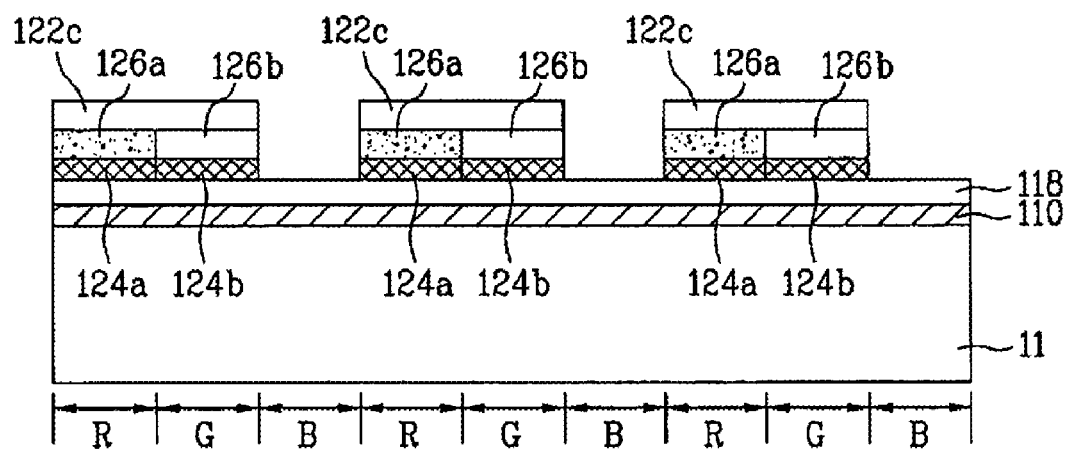
FIGS. 3A-3E are cross-sectional views illustrating alternative fabrication process of a third light emitting layer according to another embodiment of the present invention.

As shown in FIG. 3A, a third PDMS stamp (not shown in FIG. 3A), including a third OTS pattern 122c composed of a hydrophobic material, is aligned to the first carrier transport layer 118 equipped with the R-light emitting layer 126a and the G-light emitting layer 126b. The third PDMS stamp is brought into contact with the substrate 110 such that the third OTS pattern 122c is transferred to the R-light emitting layer 126a and the G-light emitting layer 126b. That is, the third PDMS stamp contacts the R-light emitting layer 126a and the G-light emitting layer 126b. Then, the third OTS pattern 122c formed on the surface of the third PDMS stamp is transferred to the R-light emitting layer 126a and the G-light emitting layer 126b. In the alternative, the third OTS pattern 122c it may also be formed by other methods, such as the roll-printing method. According to the roll printing method, the third OTS pattern 122c is formed on a printing roller using a printing plate, is transcribed on the R-light emitting layer 126a and the G-light emitting layer 126b, such that the third OTS pattern 122c is formed.

Figure 3B:
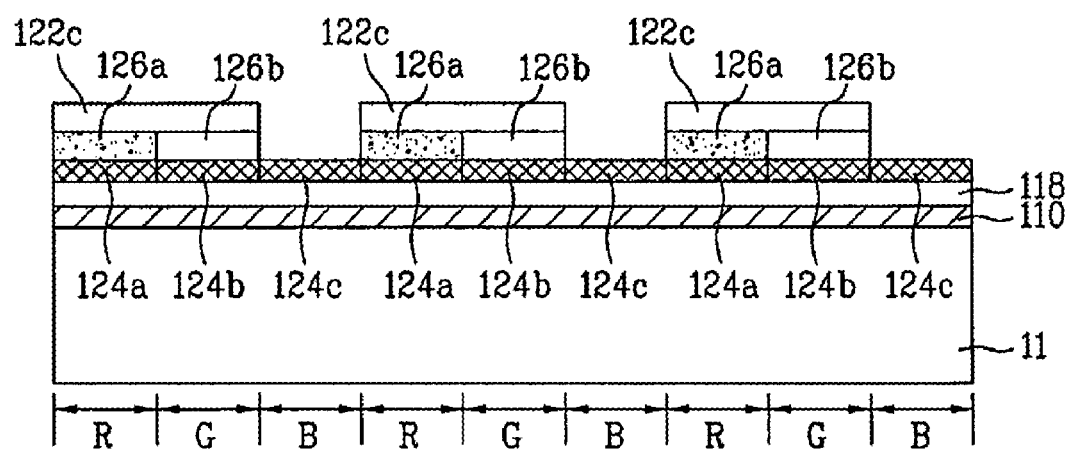

As shown in FIG. 3B, when the substrate 11 equipped with the third OTS pattern 122c is soaked into a solvent including a hydrophilic amine group, a third amine group pattern 124c made of a hydrophilic material is formed only on the first carrier transport layer 118 of the blue (b) light emitting area. The R-light emitting layer 126a and the G-light emitting layer 126b are defined as hydrophobic areas due to the third OTS pattern 122c composed of a hydrophobic material. Further, the first carrier transport layer 118 of the blue (B) light emitting area is defined as a hydrophilic area due to the third amine group pattern 124c composed of a hydrophilic material.

Figure 3C:
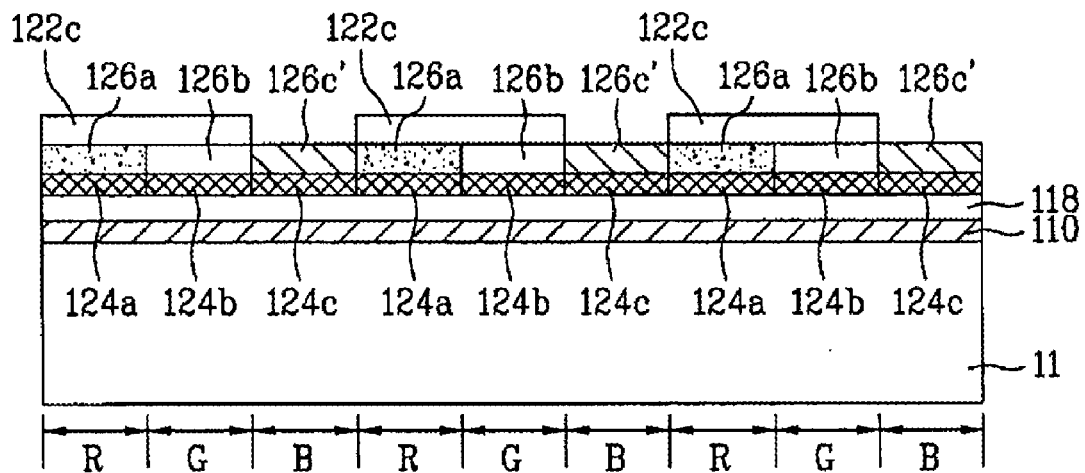

Referring to FIG. 3C, if the substrate 11 having the hydrophilic and hydrophobic areas is coated with the B-light emitting solution, the B-light emitting layer 126c' is formed only on the hydrophilic area (the third amine group pattern 124c), wherein the B-light emitting layer 126c' has a thickness between 290 Å and 390 Å. In other words, when the Blue (B) organic electroluminescent solution is coated, the B organic electroluminescent solution is not coated on the third OTS pattern 122c, and is only coated on the third amine group pattern 124c composed of a hydrophilic material.

The Blue (B) light emitting solution for forming the Blue (B) light emitting layer 126c' may be selected from among a QD (Quantum Dot) solution, a specific solution in which a small-molecule material is distributed to an organic solvent, and a solution-processing material, such as a dendrimer. In this case, the QD solution is a hydrophilic solvent having a semiconductor material quantum dot (QD), such as CdSe, CdTe or InP, having an energy band gap in a visible-ray area.

There are a variety of coating methods for providing the B-light emitting solution, for example, a pen-type coater method, a bar coater method, a slit die coating method, a solvent method, and a roll-printing method. The pen-type coater method allows a pen, blade, or slit to adhere closely to the surface of the substrate on which a light-emitting solution is deposited, applies pressure to the pen, blade or slit on the substrate surface, and pushes the pen, blade or slit in a single direction. The roll-printing method forms a predetermined pattern on a printing roller using a printing plate, and transcribes the pattern on the substrate, such that a desired pattern is formed.

Figure 3D:
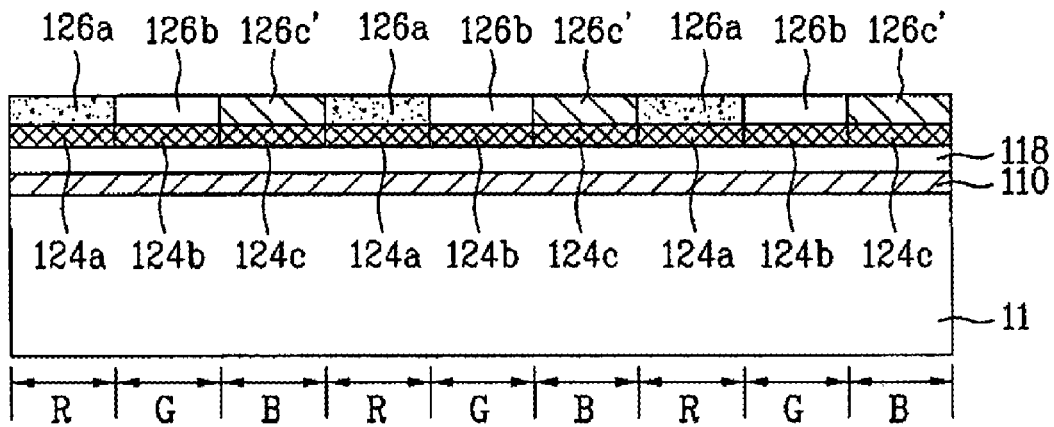

Referring to FIG. 3D, the substrate 11 having the third OTS pattern 122c is soaked in the OTS-removal solution to remove the third OTS pattern 122c such that the fabrication process of the B-light emitting layer 126c' is completed.

Figure 3E:
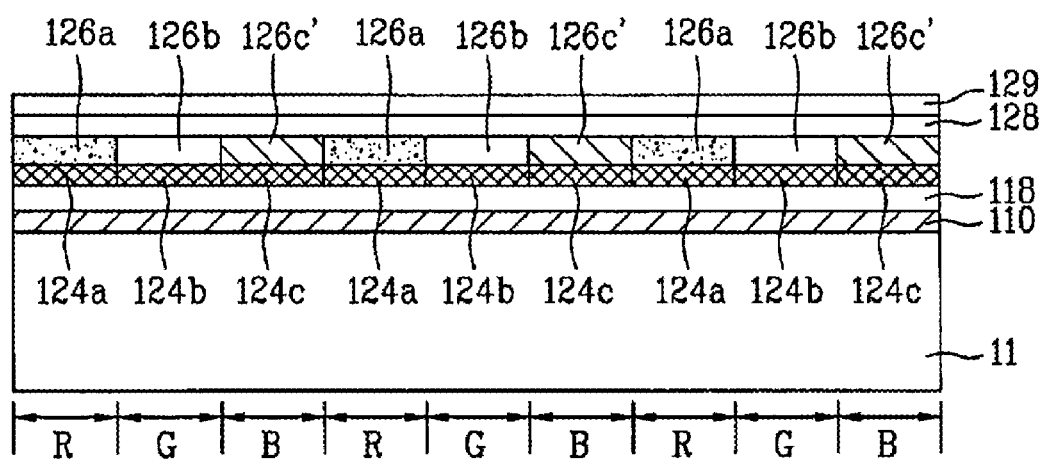

Referring to FIG. 3E, a second carrier transport layer 128 and a second electrode 129 are sequentially formed on the light emitting layers 126a, 126b and 126c'. If the second electrode 129 corresponds to a cathode electrode, the second electrode 129 may be selected from at least one metal (e.g., aluminum (AL)) having a low work function, and the second carrier transport layer 128 sequentially includes the electron transport layer and the electron injection layer. The organic electroluminescent device includes the first and second electrodes 110 and 129, The first carrier transport layer 118, the amine group patterns 124a, 124b and 124c in an amine layer, the light emitting layers 126a, 126b, and 126c' in an emitting layer, and the second carrier transport layer 128 are sequentially arranged between the first electrode 110 and the second electrode 129, such that the organic electroluminescent device is formed.

The fabrication process of the hydrophilic amine group pattern is not limited to the above-mentioned method for forming the hydrophilic amine group pattern using a hydrophilic solvent, and can be modified in various ways without departing from the spirit or scope of the invention. Further, the fabrication process of the hydrophobic OTS pattern is not limited to the above-mentioned method for forming the hydrophobic OTS pattern via the PDMS equipped with the OTS, and can be modified in various ways without departing from the spirit or scope of the invention. Although the present invention has disclosed a method for forming the G-light emitting layer after forming the R-light emitting layer, it should be noted that the scope of the present invention can also be applied to other method capable of sequentially forming the G-light emitting layer and the R-light emitting layer.

As apparent from the above description, the method for manufacturing the organic electroluminescent device according to embodiments of the present invention has the following effects. The method for manufacturing the organic electroluminescent device according to embodiments of the present invention defines a specific area, in which a light emitting layer is to be formed, as a hydrophilic area, defines another area, in which the light emitting layer is not to be formed, as a hydrophobic area, and performs the fabrication process of the light emitting layer. Therefore, embodiments of the present invention prevents the occurrence of an irregular pattern caused by a difference in dry time and viscosity of the light emitting layer, easily forms a fine light emitting layer of several micrometers (μm), and need not form/remove a partition, such that the fabrication process becomes easier. Also, the method for manufacturing the organic electroluminescent device according to embodiments of the present invention defines a specific area, in which the light emitting layer is to be formed, as a hydrophilic area, defines another area, in which the light emitting layer is not to be formed, as a hydrophobic area, and performs the fabrication process of the light emitting layer, such that it prevents a mixed color from being generated in the vicinity of an edge part of the organic electroluminescent device, resulting in the improvement of color purity of each light emitting layer.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An organic electroluminescent device, comprising:
    a first electrode and a first carrier transport layer on a substrate having sub-pixels that include a first light emitting area for a first color, a second light emitting area for a second color, and a third light emitting area for a third color;
    a first hydrophilic material on the first carrier transport layer in the first light emitting area;
    a first color light emitting layer on the first hydrophilic material in the first light emitting area;
    a second hydrophilic material on the first carrier transport layer in the second light emitting area;
    a second color light emitting layer on the second hydrophilic material in the second light emitting area;
    a third hydrophilic material on the first and second color light emitting layers and on the first carrier transport layer in the third light emitting area;
    a third color light emitting layer on the third hydrophilic material;
    a second carrier transport layer on the third color light emitting layer; and
    a second electrode on the second carrier transport layer.

* * * * *